United States Patent
Song et al.

(10) Patent No.: US 7,391,822 B2
(45) Date of Patent: Jun. 24, 2008

(54) METHOD AND APPARATUS FOR ESTIMATING A SAMPLE DELAY BETWEEN A TRANSMISSION SIGNAL AND A FEEDBACK SIGNAL IN A MOBILE COMMUNICATION SYSTEM, AND A BASE STATION TRANSMITTER USING THE SAME

(75) Inventors: Yoo-Seung Song, Suwon-si (KR);
Jae-Hyok Lee, Seoul (KR);
Seung-Hwan Lee, Seoul (KR);
Ki-Hwan Hwang, Suwon-si (KR);
Jae-Ho Jeon, Seongnam-si (KR);
Seung-Joo Maeng, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 594 days.

(21) Appl. No.: 11/126,253

(22) Filed: May 11, 2005

(65) Prior Publication Data
US 2005/0254595 A1    Nov. 17, 2005

(30) Foreign Application Priority Data
May 11, 2004    (KR) .................... 10-2004-0033008

(51) Int. Cl.
*H04L 25/49*    (2006.01)
(52) U.S. Cl. .................. 375/297; 455/114.3; 333/149
(58) Field of Classification Search ............... 375/285, 375/296–297; 455/114.2, 114.3, 63.1; 330/2, 330/149
See application file for complete search history.

(56) References Cited

U.S. PATENT DOCUMENTS

| | | | | |
|---|---|---|---|---|
| 5,903,611 A * | 5/1999 | Schnabl et al. | ............... | 375/297 |
| 5,959,500 A * | 9/1999 | Garrido | ................... | 330/151 |
| 6,185,261 B1 * | 2/2001 | Creigh et al. | ............... | 375/285 |
| 6,304,140 B1 * | 10/2001 | Thron et al. | ................ | 330/149 |
| 6,903,604 B2 * | 6/2005 | Kim | ............................ | 330/2 |
| 2002/0150171 A1 * | 10/2002 | Myers | .................... | 375/296 |
| 2003/0058959 A1 * | 3/2003 | Rafie et al. | ................ | 375/296 |

OTHER PUBLICATIONS

Shigang Tang, Ke Gong, Jun Wang, Kewu Peng, Chagyong Pan, and Zhixing Yang, Loop DElay Correction for Adaptive Digital Linearization of Power Amplifiers, 1990, IEEE Communications Society.*

\* cited by examiner

*Primary Examiner*—Khanh C. Tran
(74) *Attorney, Agent, or Firm*—Roylance, Abrams, Berdo and Goodman, LLP (57) ABSTRACT

A method and apparatus for estimating a signal delay between a transmission signal which is to be processed in a predetermined communication device of a mobile communication system, and a feedback signal. Each of the transmission and feedback signals is sampled for a predetermined length, and signal power magnitude values are computed in a sample unit and are stored in first and second memory blocks. Mean squared error (MSE) values are computed from a plurality of samples, while a start sample position of one block is shifted on a basis of a start sample position of the other block. A sample delay value is estimated from a start sample position of the one block with a smallest MSE value such that a sample delay between a transmission signal and a feedback signal is closely estimated regardless of a frequency allocation (FA) value.

15 Claims, 9 Drawing Sheets

METHOD AND APPARATUS FOR ESTIMATING A SAMPLE DELAY BETWEEN A TRANSMISSION SIGNAL AND A FEEDBACK SIGNAL IN A MOBILE COMMUNICATION SYSTEM, AND A BASE STATION TRANSMITTER USING THE SAME

CROSS-REFERENCE TO RELATED APPLICATIONS

This application claims the benefit under 35 U.S.C. § 119(a) of Korean Patent Application No. 10-2004-0033008 entitled "Method And Apparatus For Estimating A Sample Delay Between A Transmission Signal And A Feedback Signal In A Mobile Communication System, And A Base Station Transmitter Using The Same" filed in the Korean Intellectual Property Office on May 11, 2004, the entire disclosure of which is incorporated herein by reference.

BACKGROUND OF THE INVENTION

1. Field of the Invention

The present invention relates generally to a method for processing a feedback signal and a pre-distorter in a mobile communication system. More particularly, the present invention relates to a method and apparatus for stably and closely estimating a sample delay between a transmission signal and a feedback signal output from various boards of a mobile communication system regardless of a frequency allocation (FA) value. Moreover, the present invention relates to an apparatus and method for improving performance of a pre-distorter required to closely estimate a sample delay between a transmission signal and a feedback signal in a mobile communication system.

2. Description of the Related Art

Conventionally, desired signal processing is performed using a transmission signal which is to be processed and output by a designated operation routine in a board mounted in a communication device such as a base station or the like, and a feedback signal associated therewith. Delay essentially occurs according to a signal path between the transmission signal and the feedback signal. To stably process a signal, a task for estimating a signal delay and performing synchronization between the transmission and feedback signals is important.

A signal delay estimation method for performing synchronization between the transmission and feedback signals in the mobile communication system is referred to as a sample delay estimation method. For example, a conventional sample delay estimation method stores a plurality of samples of the transmission and feedback signals, performs a correlation operation on the stored samples, and estimates a sample delay interval with the largest correlation value. A method for estimating the sample delay interval is conventionally referred to as rough delay estimation.

Furthermore, the mobile communication system performs fine delay estimation for estimating a sample delay interval using the conventional rough delay estimation method using the largest correlation value, performing time synchronization between the transmission and feedback signals, and finely dividing the estimated sample delay interval, for example, in a 1/10 sample interval. Moreover, the mobile communication system performs desired signal processing based on signal synchronization between the transmission and feedback signals using the sample delay interval estimated by the fine delay estimation.

A signal processor is required to estimate the sample delay interval between the transmission and feedback signals and is comprised of a digital pre-distorter provided in a base station transmitter or other location. A power amplifier is also required for amplifying the transmission signal in the base station transmitter. The power amplifier has non-linear operation characteristics.

Because a high power amplifier (HPA) which is widely used to obtain high efficiency in the base station transmitter of the mobile communication system operates close to a non-linear operation point, the power amplifier generates an inter-modulation distortion (IMD) component. The IMD component affects other frequency bands, as well as in-band. Accordingly, the pre-distorter generates a pre-distortion signal having the same signal size as that of the IMD component generated from the power amplifier and having a phase that is opposite to the phase of the IMD component. The pre-distorter compensates an output signal of the power amplifier using the pre-distortion signal. Accordingly, the output signal of the power amplifier has linear characteristics.

The pre-distorter receives the output signal of the power amplifier for signal compensation as a feedback signal, and performs a digital pre-distortion (DPD) algorithm for eliminating a spurious component. Samples of both the transmission and feedback signals must be stored during a previous phase, and a sample delay interval must be estimated using the stored samples, such that the DPD algorithm can be performed.

However, the conventional sample delay estimation method has a problem in that an error of the estimated sample delay interval occurs according to a frequency allocation (FA) value of the transmission and feedback signals serving as input signals. For example, in a code division multiple access (CDMA) 2000 1x system, a sample delay interval is closely estimated from 12-FA input signals in a block with a size of 1,024 samples. However, a significant error in the sample delay interval estimated from the input signals with a small FA value also occurs in the block with a size of 1,024 samples.

Figure 1A:
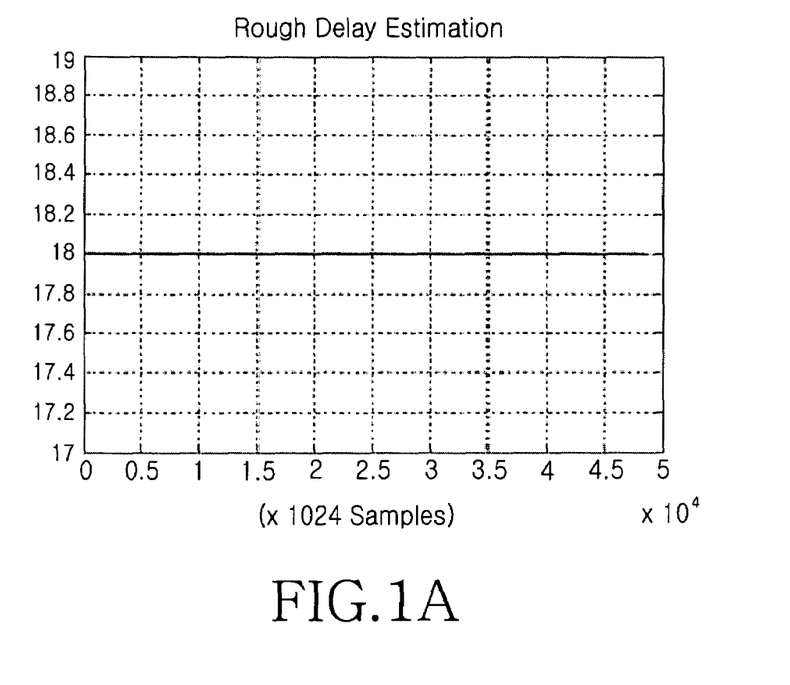
FIGS. 1A through 1C are waveform diagrams illustrating simulation results obtained by estimating a sample delay interval from input signals while varying a frequency allocation (FA) value according to a conventional sample delay estimation method.
Figure 1B:
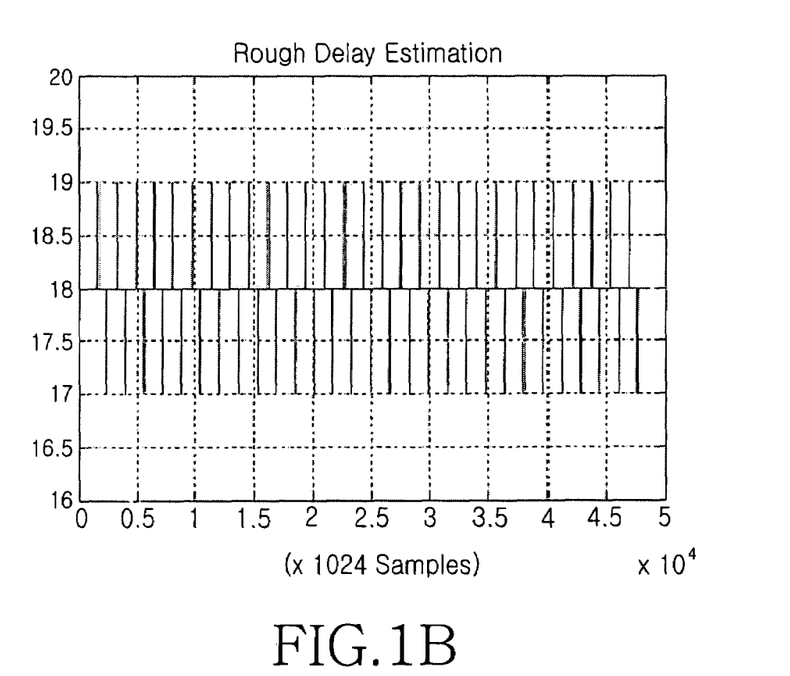
Figure 1C:
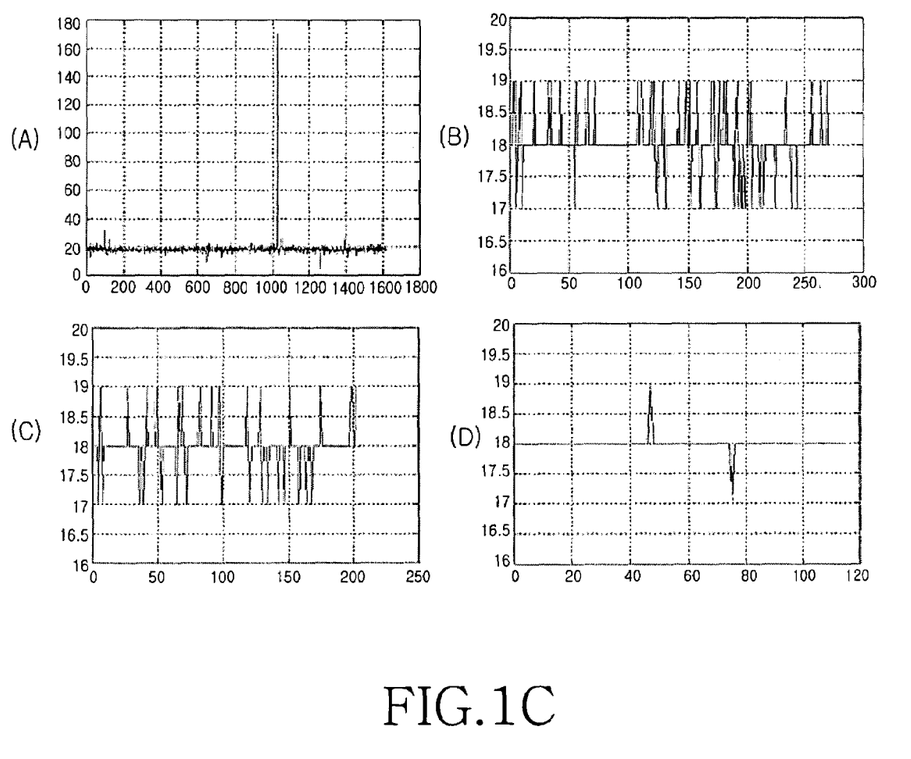

FIGS. 1A through 1C are waveform diagrams illustrating simulation results according to a conventional sample delay estimation method, and illustrate the results of the conventional rough delay estimation for storing a plurality of samples of transmission and feedback signals as input signals, performing the maximum correlation operation on the stored samples, and estimating the sample delay interval.

First, FIG. 1A illustrates simulation results obtained by estimating a sample delay interval from 12-FA CDMA 2000 1x input signals in a unit of 1,024 samples. It can be found that a sample delay interval regularly converges, for example, in an 18-sample interval. Next, FIG. 1B illustrates simulation results obtained by estimating a sample delay interval from 4-FA CDMA 2000 1x input signals in the unit of 1,024 samples. The FA value of FIG. 1B is less than that of FIG. 1A. As illustrated in FIG. 1B, it can be found that an error in a sample delay interval estimated between a 17-sample interval and a 19-sample interval occurs. The waveforms (A), (B), (C), and (D) of FIG. 1C represent accumulated simulation results obtained by repeating a rough delay estimation operation on 1-FA CDMA 2000 1x input signals 1, 6, 8, and 14 times. When the accumulated number of times increases, it can be found that an error in an estimated delay interval is gradually reduced.

Since an estimation error in a sample delay interval is large when an FA value is small in the case of the conventional rough delay estimation, it is difficult for a sample delay to be closely estimated. Also, since the sample block length or the number of estimation operations must be increased such that an estimation error can be reduced in the case of a system with a small FA value, there is a problem in that system resources are wasted.

Accordingly, a need exists for a method and apparatus that can closely estimate a sample delay between a transmission signal and a feedback signal regardless of a frequency allocation (FA) value by using minimal system resources.

SUMMARY OF THE INVENTION

It is, therefore, an aspect of the present invention to provide a sample delay estimation method and apparatus that can closely estimate a sample delay between a transmission signal and a feedback signal regardless of a frequency allocation (FA) value in a mobile communication system.

It is another aspect of the present invention to provide a sample delay estimation method and apparatus that can improve the performance of a pre-distorter in a mobile communication system.

It is yet another aspect of the present invention to provide a base station transmitter with a sample delay estimator that can improve the performance of a pre-distorter in a mobile communication system.

The above and other aspects of the present invention can be achieved by providing a method for estimating a signal delay between a transmission signal and a feedback signal, the method includes the steps of sampling each of the transmission and feedback signals for a predetermined length, and computing signal power magnitude values in a sample unit, storing each of the signal power magnitude values of the transmission and feedback signals in memory blocks, computing mean squared error (MSE) values by processing corresponding signal power magnitude values while shifting a start sample position of one signal between the sampled transmission and feedback signals on a basis of a start sample position of another signal, and estimating a sample delay value from the shifted start sample position with a smallest MSE value.

The method further includes the step of computing an MSE value between samples at least two times.

The above and other aspects of the present invention can also be achieved by providing an apparatus for estimating a signal delay between a transmission signal and a feedback signal, the apparatus includes a sample extractor for extracting samples with a predetermined length from the transmission and feedback signals, a signal magnitude calculator for computing power magnitude values of the transmission and feedback signals in a sample unit, memory blocks for storing the power magnitude values of the transmission and feedback signals, and a delay estimator for computing mean squared error (MSE) values by processing corresponding signal power magnitude values while shifting a start sample position of one signal between the sampled transmission and feedback signals on a basis of a start sample position of another signal, and estimating a sample delay value from the shifted start sample position with a smallest MSE value.

The above and other aspects of the present invention can also be achieved by providing a transmitter of a mobile communication system with a power amplifier. The transmitter includes a digital pre-compensator that is configured to generate a pre-distortion signal to linearize an output signal of the power amplifier on a basis of a predetermined coefficient, and a digital signal processor that is configured to perform delay compensation between a transmission signal and a feedback signal, and determine the coefficient, the digital signal processor comprises a PD adapter. The PD adapter is configured to compute the coefficient by performing an adaptation algorithm, and updates a look-up table (LUT) of the digital pre-compensator, and a loop delay tracker that is configured to compute mean squared error (MSE) values by processing corresponding signal power magnitude values while shifting one signal between the sampled transmission and feedback signals on a basis of a start sample position of another signal, and estimate a sample delay value from the shifted start sample position with a smallest MSE value.

BRIEF DESCRIPTION OF THE DRAWINGS

The above and other aspects and advantages of the present invention will be more clearly understood from the following detailed description taken in conjunction with the accompanying drawings, in which.

Throughout the drawings, like reference numerals will be understood to refer to like parts, components and structures.

DETAILED DESCRIPTION OF THE EXEMPLARY EMBODIMENTS

A number of exemplary embodiments of the present invention will now be described in greater detail with reference to the accompanying drawings. In the following description, detailed descriptions of known functions and configurations incorporated herein are omitted for clarity and conciseness.

An exemplary method for estimating a sample delay between a transmission signal and a feedback signal in accordance with an embodiment of the present invention is described first, followed by a description of a sample delay estimation apparatus employing a method for estimating a sample delay between a transmission signal and a feedback signal in accordance with an embodiment of the present invention.

In the embodiments of the present invention, the term 'transmission signal' denotes a high frequency signal which is to be processed in various communication devices, such as a base station and the like, that comprise a mobile communication system, and the term 'feedback signal' denotes a signal fed back from an output terminal of the communication device. An example of an apparatus to which the sample delay estimation method can be applied comprises a pre-distorter for linearly compensating a non-linear output signal of a high power amplifier (HPA) in a base station transmitter. An exemplary pre-distorter will now be described in greater detail.

Since a high frequency signal which is to be processed in the mobile communication system has a phase, the transmission and feedback signals are classified into in-phase (I) and quadrature (Q) components. The magnitudes of both of the transmission and feedback signals are expressed in the form of a square root. When the I and Q components of the transmission signal are given as $Tx_{In}$ and $Tx_{Qn}$, respectively, and the I and Q components of the feedback signal are given as $Fb_{In}$ and $Fb_{Qn}$, respectively, the magnitudes $Tx_n$ and $Fb_n$ are defined as shown below in Equations (1) and (2), respectively.

$$Tx_n = \sqrt{Tx_{In}^2 + Tx_{Qn}^2} \quad \text{Equation (1)}$$

$$Fb_n = \sqrt{Fb_{In}^2 + Fb_{Qn}^2} \quad \text{Equation (2)}$$

Figure 2:
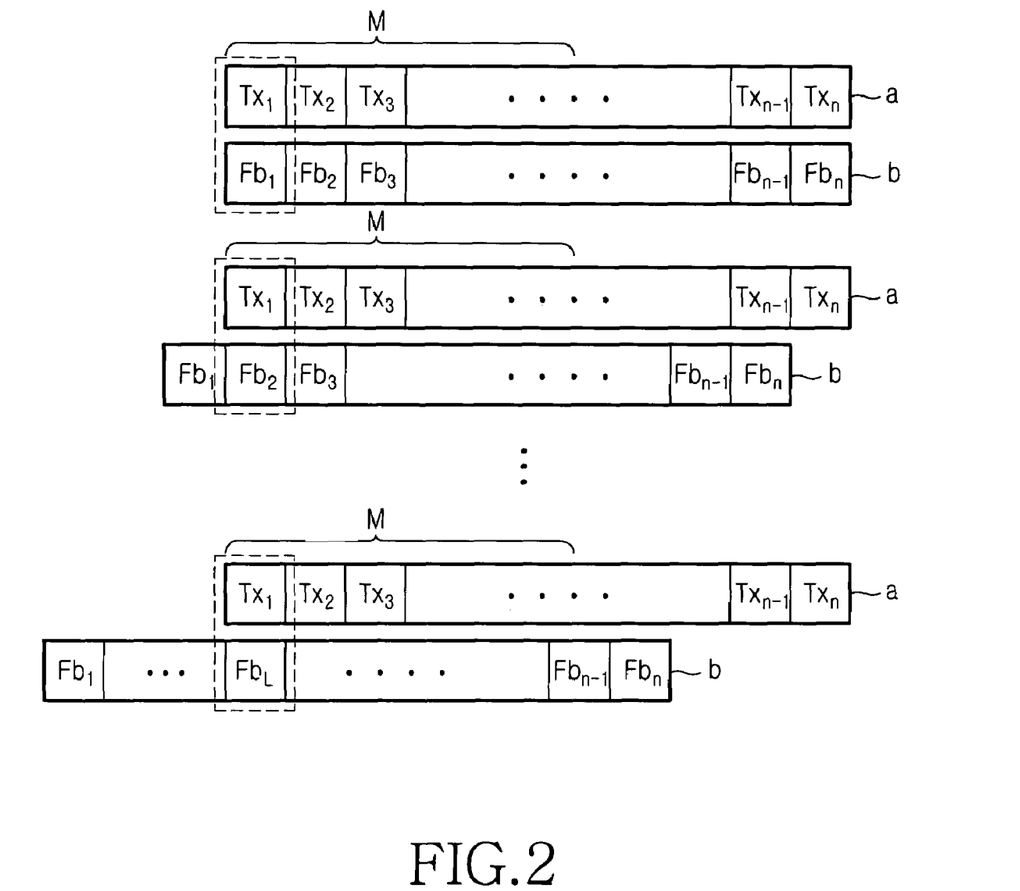
FIG. 2 is a conceptual diagram illustrating a method for estimating a sample delay between a transmission signal and a feedback signal in a mobile communication system in accordance with an embodiment of the present invention.

FIG. 2 is a conceptual diagram illustrating a method for estimating a sample delay between a transmission signal and a feedback signal in a mobile communication system in accordance with an embodiment of the present invention. In the embodiments of the present invention, magnitude values of sampled transmission and feedback signals are stored in a memory block with a predetermined length. The memory block includes a first memory block 'a' for sequentially storing magnitude values $Tx_1 \sim Tx_n$ of the sampled transmission signal, and a second memory block 'b' for sequentially storing magnitude values $Fb_1 \sim Fb_n$ of the sampled feedback signal. Here, the first memory block and second memory block can be comprised of a physical or logical memory. In the embodiments of the present invention, a sample delay estimation operation computes error values between M samples stored in the first and second memory blocks 'a' and 'b', while shifting a start sample position of the second memory block 'b' to $Fb_1 \Rightarrow Fb_2 \Rightarrow \ldots \Rightarrow Fb_L$ on the basis of a start sample position $Tx_1$ of the first memory block 'a' as illustrated in FIG. 2. A sample delay value is estimated from a start sample position of the feedback signal with the smallest error value. The sample delay value is computed using a mean squared error (MSE) as defined below in Equation (3).

$$MSE = \sum_{n=1}^{M} \frac{(Tx_n - Fb_n)^2}{M} \quad \text{Equation (3)}$$

Alternatively, in the embodiments of the present invention, a sample delay estimation operation (not illustrated) can compute error values between M samples stored in the first and second memory blocks 'a' and 'b', while shifting a start sample position of the first memory block 'a' to $Tx_1 \Rightarrow Tx_2 \Rightarrow \ldots \Rightarrow Tx_L$ on the basis of a start sample position $Fb_1$ of the second memory block 'b'. A sample delay value is estimated from a start sample position of the transmission signal with the smallest error value.

A method for estimating a sample delay between transmission and feedback signals in accordance with an embodiment of the present invention will now be described in greater detail with reference to FIGS. 3 and 4.

Figure 3:
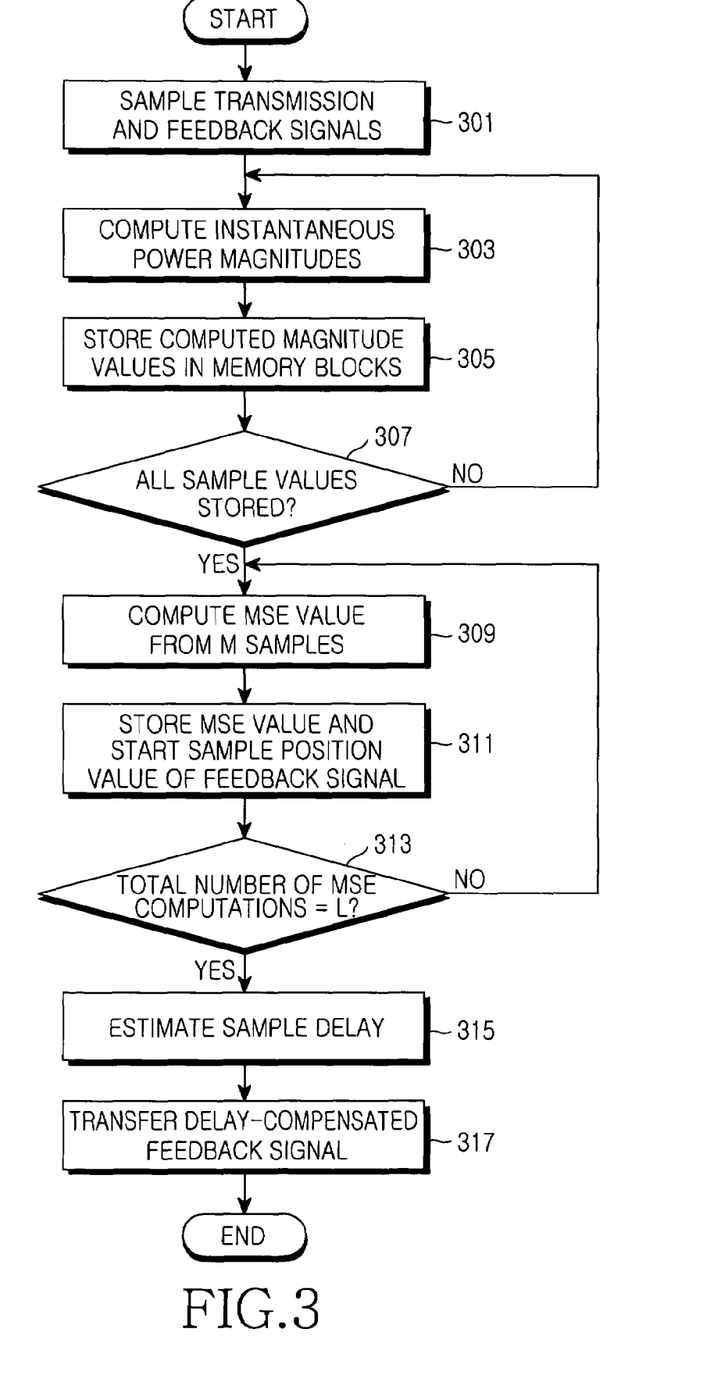
FIG. 3 is a flow chart illustrating a method for estimating a sample delay between a transmission signal and a feedback signal in a mobile communication system in accordance with an embodiment of the present invention.

FIG. 3 is a flow chart illustrating a method for estimating a sample delay between a transmission signal and a feedback signal in a mobile communication system in accordance with an embodiment of the present invention.

First, a transmission signal which is to be processed in a predetermined communication device of the mobile communication system and a feedback signal are sampled in a sample unit for a predetermined length in step 301. The sampled transmission and feedback signals are classified into I and Q components in step 303. As shown in Equations (1) and (2), the I and Q components are squared, respectively. When the square root of the sum of the squares of the I and Q components is computed, instantaneous power magnitude values of the sampled transmission and feedback signals are computed. The computed instantaneous power magnitude values of the sampled transmission and feedback signals are separately stored in the first and second memory blocks 'a' and 'b', respectively, in step 305.

In this case, the first memory block 'a' sequentially stores instantaneous power magnitude values $Tx_1 \sim Tx_n$ of the transmission signal in the sample unit, and the second memory block 'b' sequentially stores instantaneous power magnitude values $Fb_1 \sim Fb_n$ of the feedback signal in the sample unit. Samples of the first instantaneous power magnitude values $Tx_1$ and $Fb_1$ stored in the first and second memory blocks 'a' and 'b', respectively, are designated as initial start samples. Steps 303 and 305 are repeatedly performed as indicated by the NO branch of step 307 until 'n' instantaneous power magnitude values of the transmission and feedback signals are computed and stored in the first and second memory blocks 'a' and 'b', respectively. In step 307, a determination is made as to whether all sample values have been stored in the first and second memory blocks 'a' and 'b'.

In step 309, an MSE value between M samples stored in the first and second memory blocks 'a' and 'b' is computed using Equation (3), while a start sample position of the second memory block 'b' is shifted by a unit of one sample on the basis of the start sample position $Tx_1$ of the first memory block 'a'.

The MSE value computed in step 309 is stored corresponding to a start sample position value of the feedback signal in step 311. Steps 309 and 311 are repeatedly performed L times as indicated by the NO branch of step 313. Because the number of samples of the transmission and feedback signals from which an MSE value is computed is less than 'n', as a start sample position of the second memory block 'b' is shifted, a value of M is properly selected in a range wherein it does not exceed the total number of samples 'n'. It is preferred that the number of MSE computations 'L' between M samples is selected to be within an expected sample interval range to which a sample delay interval will converge as illustrated in FIGS. 1A to 1C. The number of MSE computations 'L' is determined by experimentation.

In step 315, a sample delay value is estimated from a start sample position of the feedback signal associated with a corresponding MSE value after the smallest value of the computed MSE values is retrieved. In step 317, the sample delay value is used as a compensated delay value of the feedback signal for signal synchronization between the transmission and feedback signals.

Figure 4:
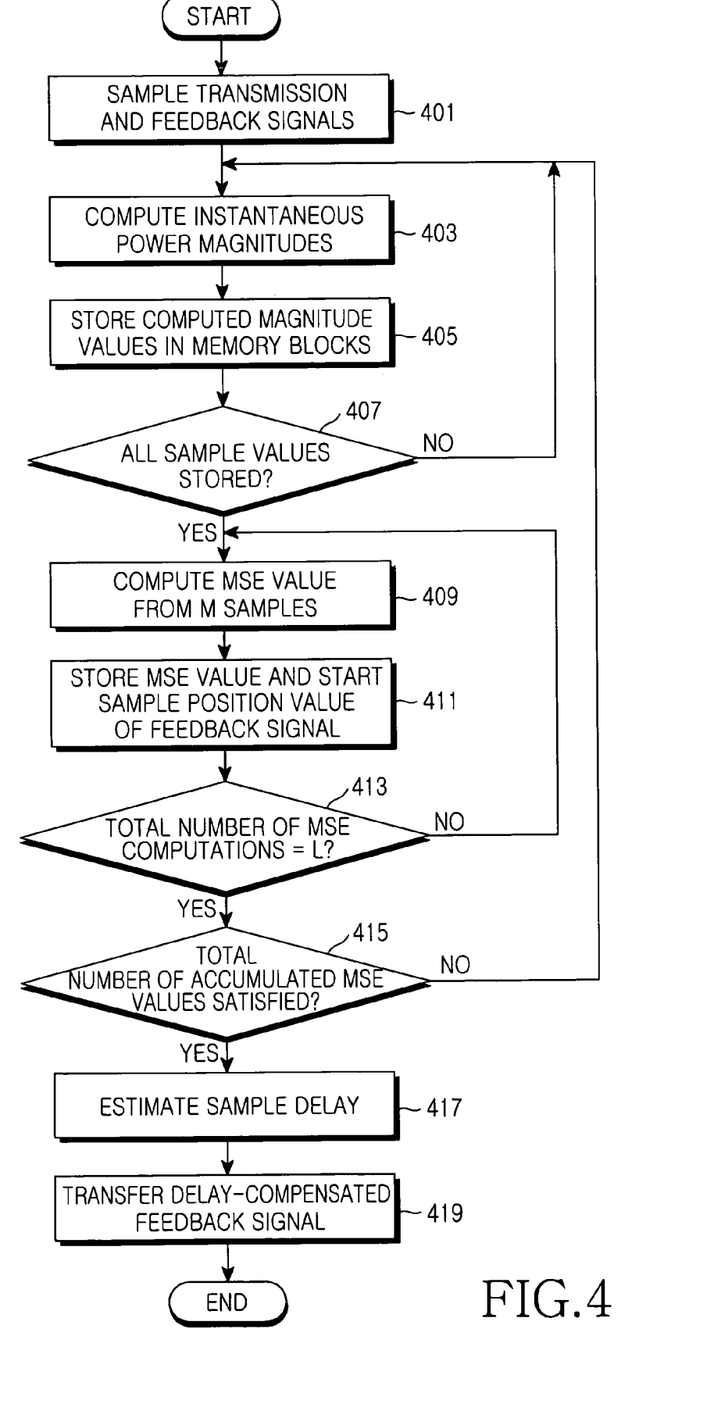
FIG. 4 is a flow chart illustrating a method for estimating a sample delay between a transmission signal and a feedback signal in a mobile communication system in accordance with another embodiment of the present invention.

FIG. 4 is a flow chart illustrating a method for estimating a sample delay between a transmission signal and a feedback signal in a mobile communication system in accordance with another embodiment of the present invention. The embodiment of FIG. 4 reduces an error range of a sample delay value computed in the mobile communication system using a relatively small FA value by accumulating MSE values computed in FIG. 3 over a predetermined number of times.

Steps 401 to 413 of the method of FIG. 4 are substantially the same as steps 301 to 313 of the method of FIG. 3 for sampling the transmission and feedback signals in the sample unit, computing instantaneous power magnitude values of the sampled signals, sequentially storing the computed instantaneous power magnitude values in the first and second memory blocks 'a' and 'b' in the sample unit, and computing MSE values between M samples stored in the first and second memory blocks 'a' and 'b' while shifting a start sample position of the feedback signal. Accordingly, a detailed description of steps 401 to 413 of the method of FIG. 4 is omitted.

In FIG. 4, steps 403 to 413 are repeatedly performed a predetermined number of times as indicated by the NO branch of step 415, such that accumulated MSE values between M samples stored in the first and second memory blocks 'a' and 'b' can be computed. In step 417, a sample delay value is estimated from a start sample position of the feedback signal associated with a corresponding MSE value after the smallest value of the accumulated MSE values is retrieved. In step 419, the sample delay value is used as a compensated delay value of the feedback signal.

When a sample delay value is estimated while a start sample position of the transmission signal is shifted on the basis of a start sample position of the feedback signal, only a reference signal is different, and an estimation method is substantially the same as the methods of FIGS. 3 and 4.

Figure 5A:
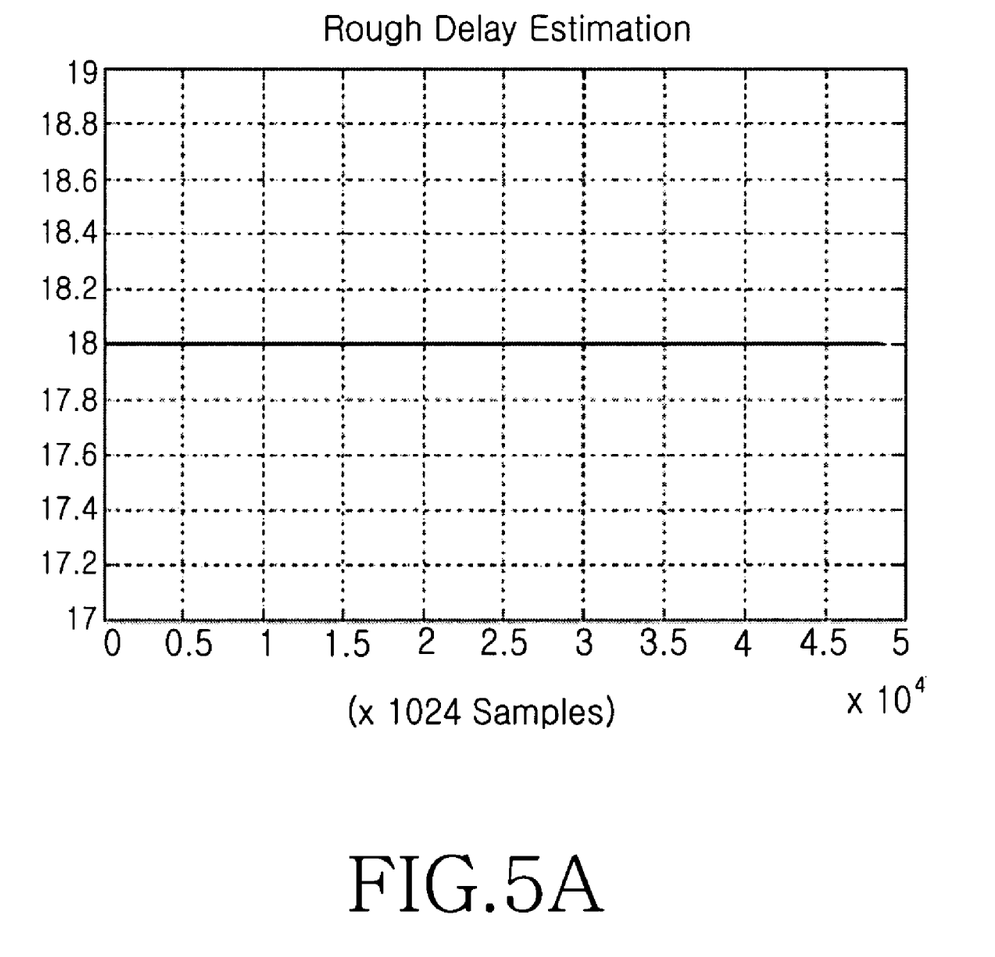
FIGS. 5A and 5B are waveform diagrams illustrating simulation results obtained by estimating a sample delay interval from input signals while varying an FA value according to a sample delay estimation method in accordance with an embodiment of the present invention.
Figure 5B:
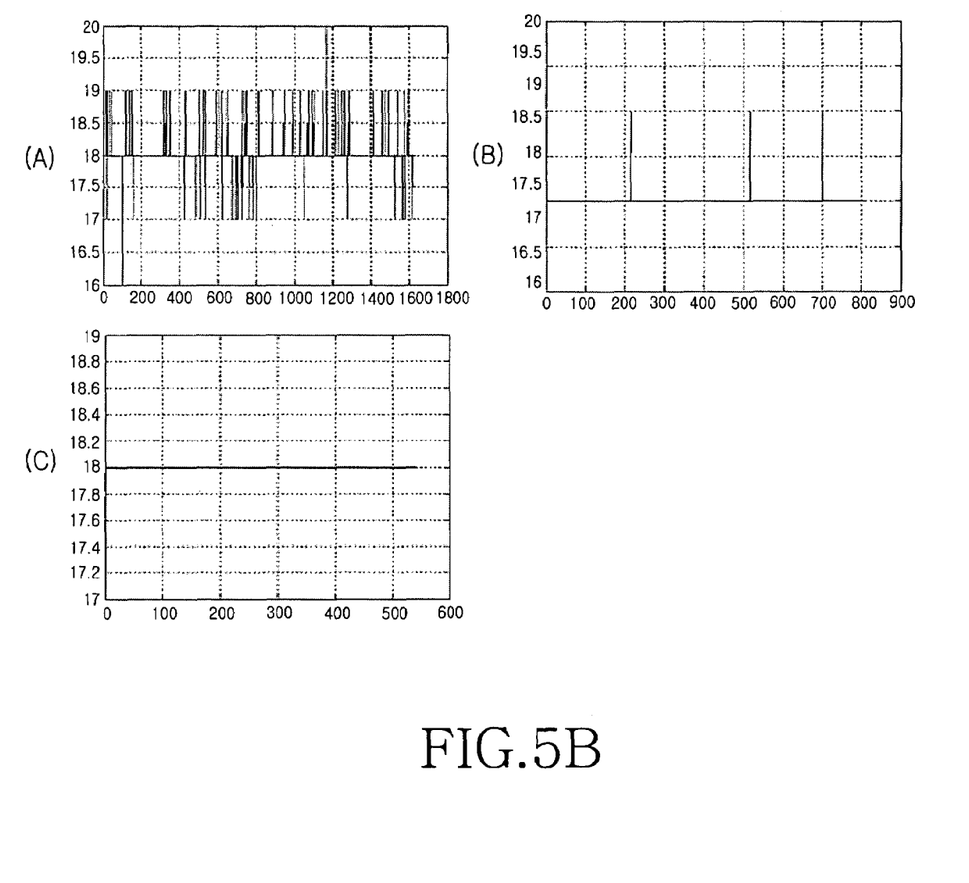

FIGS. 5A and 5B are waveform diagrams illustrating simulation results according to a sample delay estimation method in accordance with an embodiment of the present invention. FIG. 5A illustrates simulation results obtained by estimating the sample delay interval from 12-FA or 4-FA CDMA 2000 1x input signals in a unit of 1,024 samples. It can be found that a sample delay interval regularly converges, for example, in an 18-sample interval. The waveforms (A), (B), and (C) of FIG. 5B represent accumulated simulation results obtained by repeating a rough delay estimation operation on 1-FA CDMA 2000 1x input signals 1, 2, and 3 times. Although the accumulated number of times in FIG. 5B is less than that in the conventional sample delay estimation method of FIG. 1C, it can be found that a convergence error in an estimated sample delay interval is significantly reduced.

Figure 6:
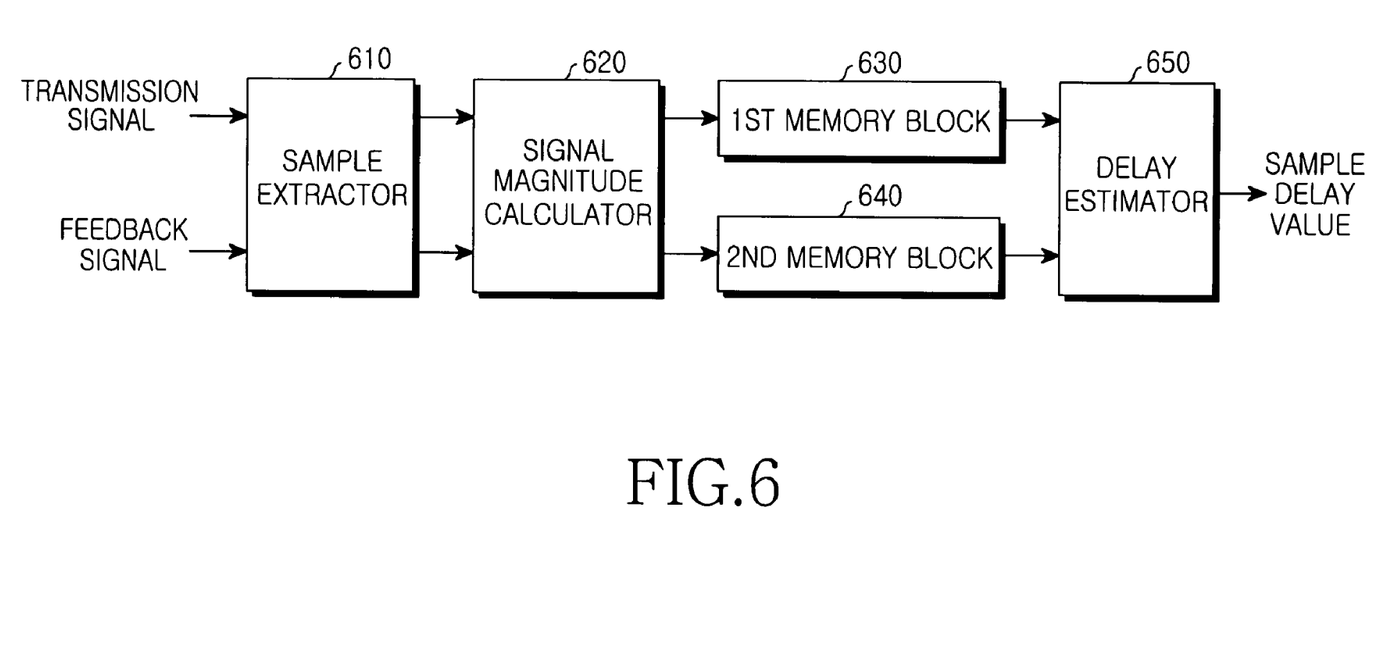
FIG. 6 is a block diagram illustrating an apparatus for estimating a sample delay between a transmission signal and a feedback signal in a mobile communication system in accordance with an embodiment of the present invention.

An apparatus for performing the sample delay estimation method of FIGS. 3 and 4 in accordance with an embodiment of the present invention will now be described in greater detail. FIG. 6 is a block diagram illustrating an apparatus for estimating a sample delay between a transmission signal and a feedback signal in a mobile communication system in accordance with an embodiment of the present invention.

A transmission signal which is to be processed in a communication device such as a base station transmitter in the mobile communication system, and a feedback signal fed back from an output terminal of the communication device, are each transferred to a sample extractor 610 through different signal paths. The sample extractor 610 extracts samples with a predetermined length from the input transmission and feedback signals, and outputs the extracted samples to a signal magnitude calculator 620. The signal magnitude calculator 620 classifies the extracted samples into I and Q components, and computes instantaneous power magnitude values in a sample unit using Equations (1) and (2).

The instantaneous power magnitude values of the transmission signal are output to the first memory block 630 (as indicated by 'a' in FIG. 2), and the instantaneous power magnitude values of the feedback signal are output to the second memory block 640 (as indicated by 'b' in FIG. 2). The first and second memory blocks 630 and 640 store 'n' samples, respectively. Samples of the first instantaneous power magnitude values $Tx_1$ and $Fb_1$ stored in the first and second memory blocks 630 and 640, respectively, are designated as initial start samples.

A delay estimator 650 of FIG. 6 computes MSE values between M samples stored in the first and second memory blocks 630 and 640, while shifting a start sample position of the feedback signal of the second memory block 640 L times by a unit of one sample interval as illustrated in FIG. 2. The delay estimator 650 estimates a sample delay value from a start sample position of the feedback signal with the smallest MSE value, and then outputs the estimated sample delay value.

Alternatively, the delay estimator 650 may estimate the sample delay value while shifting a start sample position of the transmission signal on the basis of a start sample position of the feedback signal. Subsequently, the communication device such as the base station transmitter, delays the feedback signal according to the computed sample delay value, and performs signal synchronization between the transmission and feedback signals.

An example in which a method for estimating a sample delay between the transmission and feedback signals in accordance with an embodiment of the present invention is applied to the mobile communication system, will now be described in greater detail.

Figure 7:
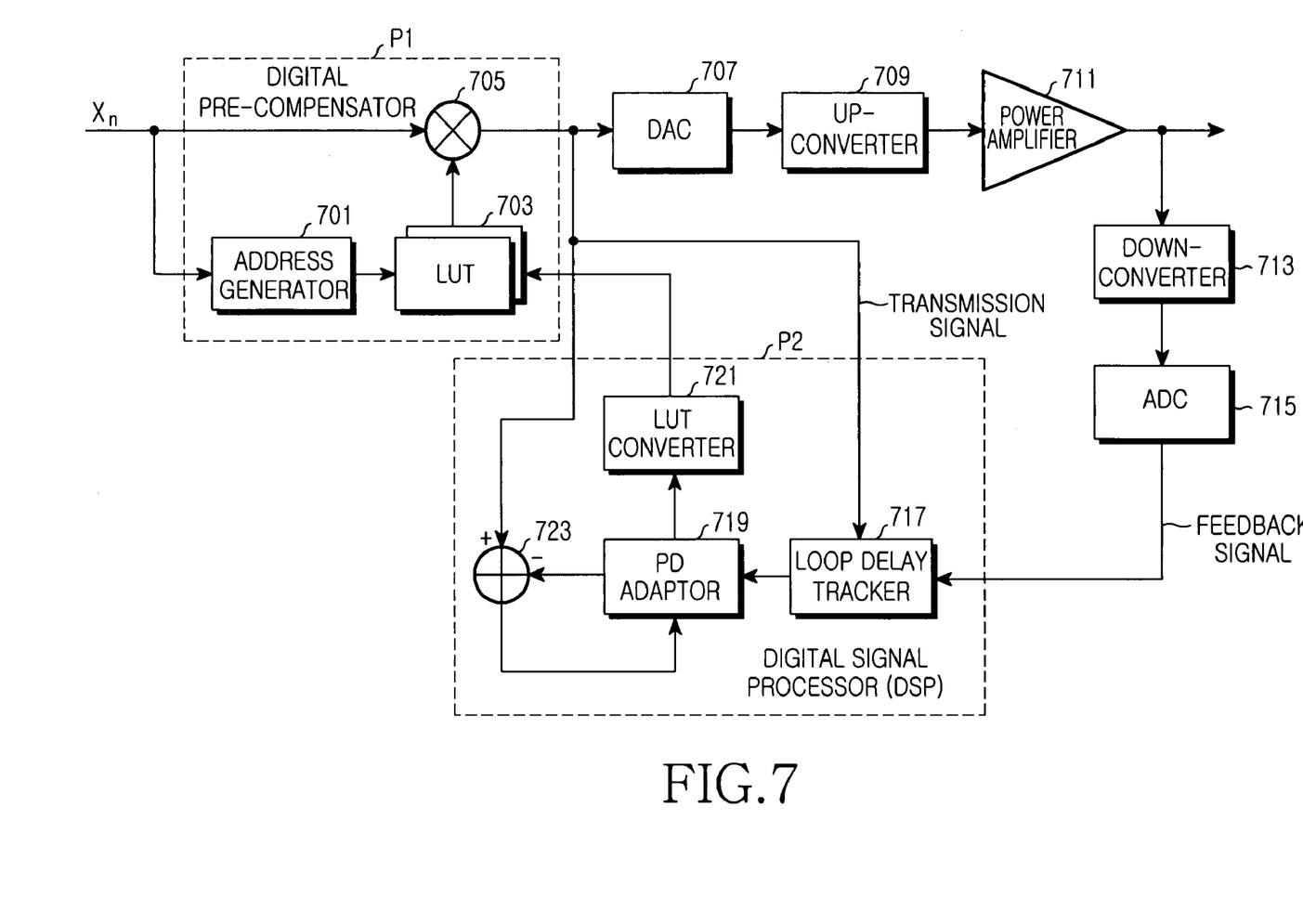
FIG. 7 is a schematic diagram illustrating a base station transmitter with a pre-distorter to which an embodiment of the present invention is applied.

FIG. 7 is a schematic diagram illustrating a base station transmitter with a pre-distorter to which an embodiment of the present invention is applied.

A high power amplifier (HPA) as is widely used in a mobile communication system, operates up to a non-linear operation point, for example, a P1 point (e.g., 1-dB compression point), to increase its efficiency. A transmission signal going through the non-linear power amplifier generates an inter-modulation distortion (IMD) component. The IMD component acting as a noise component, affects other frequency bands as well as in-band. The above-described digital pre-distortion (DPD) algorithm can be used for compensating for the influence of the IMD component.

The base station transmitter of FIG. 7 comprises a digital pre-compensator P1 operating as a pre-distorter in an input stage of a power amplifier 711. The digital pre-compensator P1 generates an arbitrary pre-distortion signal such that an output signal of the power amplifier 711 is linearized.

The digital pre-compensator P1 operates according to the DPD algorithm. The DPD algorithm uses a memory polynomial scheme that is a simplified form of the conventional Volterra scheme. The memory polynomial DPD algorithm uses an adaptation algorithm to eliminate a non-linear component and a memory effect component from the output signal of the power amplifier 711.

A digital signal processor (DSP) P2 for performing the adaptation algorithm, is connected between the digital pre-compensator P1 and the power amplifier 711. This adaptation algorithm minimizes a pre-distortion error using a least mean square (LMS) scheme, and is performed through a pre-distortion (PD) adapter 719 of FIG. 7. The PD adapter 719 computes a proper coefficient of the memory polynomial according to a result obtained by performing the adaptation algorithm, and updates a look-up table (LUT) 703 of the digital pre-compensator P1. For example, the memory polynomial can be implemented by a finite impulse response (FIR) filter.

A loop delay tracker 717 with the sample delay estimator of FIG. 6, is connected to an input terminal of the PD adapter 719. The loop delay tracker 717 estimates a sample delay value between a transmission signal extracted from an output terminal of the digital pre-compensator P1 and a feedback signal extracted from an output terminal of the power amplifier 711, and provides the PD adapter 719 with a delay-compensated feedback signal.

The operation of the base station transmitter configured as illustrated in FIG. 7 will now be described in greater detail.

An address generator 701 of the digital pre-compensator P1 computes an instantaneous power magnitude of an input signal $X_n$, and determines an address mapped to the computed instantaneous power magnitude from the LUT 703. The LUT 703 stores, in advance, digital data of pre-distortion values according to address values mapped to input signal ($X_n$) magnitudes, and outputs to a multiplier 705, a pre-distortion value mapped to an address value transferred from the address generator 701. The multiplier 705 performs the complex multiplication of the input signal $X_n$ and the pre-distortion value, and outputs a pre-distorted transmission signal.

The pre-distorted transmission signal is transferred to an input terminal of the loop delay tracker 717 and an input terminal of a digital-to-analog converter (DAC) 707. The DAC 707 converts the pre-distorted transmission signal into an analog signal. An up-converter 709 up-converts the analog signal into a desired carrier frequency band, and provides the power amplifier 711 with the up-converted transmission signal.

The power amplifier 711 amplifies the up-converted transmission signal. The amplified signal, from which a non-linear component has been eliminated due to the pre-distorted signal, is then output. The output signal of the power amplifier 711, acting as the feedback signal, is then transferred to an input terminal of a down-converter 713. The down-converter 713 down-converts the feedback signal into an intermediate frequency (IF) band. An analog-to-digital converter (ADC) 715 converts the down-converted feedback signal into a digital signal and then transfers the digital signal to the other input terminal of the loop delay tracker 717.

The loop delay tracker 717 of the digital signal processor P2 samples the transmission signal transferred from the digital pre-compensator P1 and the feedback signal transferred from the output terminal of the power amplifier 711 for a predetermined length, and computes signal power magnitudes of the sampled signals in a sample unit. The loop delay tracker 717 sequentially stores the computed signal power magnitude values in the first and second memory blocks of FIG. 2 in the sample unit, and computes MSE values between M samples stored in the first and second memory blocks while shifting a start sample position of the feedback or transmission signal.

The loop delay tracker 717 then estimates a sample delay value from a start sample position of the feedback or transmission signal mapped to the smallest value of the computed MSE values, and outputs a delay-compensated feedback signal to the PD adapter 719. The PD adapter 719 receives the delay-compensated feedback signal and computes a coefficient of the memory polynomial in which a value obtained by subtracting the first output of the PD adapter 719 from the transmission signal transferred by the digital pre-compensator P1 converges to 0. The PD adapter 719 then transfers the computed coefficient as its second output to an LUT converter 721.

The coefficient is computed through the adaptation algorithm based on LMS, and the adaptation algorithm is performed using Equation (4) shown below.

$$w(k+1) = w(k) + \mu u(k) e^*(k) \quad \text{Equation (4)}$$

In Equation (4), w(k) denotes a coefficient of the memory polynomial, u(k) denotes a delay-compensated feedback signal, e(k) denotes a value obtained by subtracting the first output of the PD adapter 719 from the transmission signal, μ denotes a convergence coefficient (in this example, μ<1), and the asterisk (*) of the e(k) value denotes the conjugate. The convergence coefficient of the memory polynomial serving as the second output of the PD adapter 719 is transferred to the LUT converter 721. The LUT converter 721 converts the coefficient into a table value for inclusion in the LUT 703, and updates a table value of the LUT 703 accordingly.

The base station transmitter of FIG. 7 generates a pre-distortion signal from the digital pre-compensator P1, and linearizes an output signal of the power amplifier 711. In this process, a sample delay value is closely estimated between a transmission signal and a feedback signal regardless of a frequency allocation (FA) value of an input signal $X_n$. Therefore, the performance of the digital pre-compensator P1 is improved, and thus, the output signal of the power amplifier can be closely linearized.

As is apparent from the above description, the present invention provides a sample delay estimation method and apparatus that can closely estimate a sample delay between a transmission signal and a feedback signal regardless of an FA value in a mobile communication system, thereby saving system resources.

In accordance with the present invention, a sample delay between a transmission signal and a feedback signal can be stably and closely estimated regardless of an FA value, such that the performance of a pre-distorter provided in a base station transmitter can be greatly improved.

While the present invention has been shown and described with reference to a number of exemplary embodiments thereof, it will be understood by those skilled in the art that various changes in form and details may be made therein without departing from the spirit and scope of the invention as defined by the appended claims.

What is claimed is:

1. A method for estimating a signal delay between a transmission signal and a feedback signal, the method comprising the steps of:

sampling each of the transmission and feedback signals for a predetermined length, and computing signal power magnitude values in a sample unit;

storing each of the signal power magnitude values of the transmission and feedback signals in memory blocks;

computing mean squared error (MSE) values by processing corresponding signal power magnitude values while shifting a start sample position of one signal between the sampled transmission and feedback signals on a basis of a start sample position of another signal; and estimating a sample delay value from the shifted start sample position with a smallest MSE value.

2. The method according to claim 1, further comprising the steps of:

sequentially storing n samples of the transmission and feedback signals in the memory blocks; and computing the MSE value from a number of samples less than n.

3. The method according to claim 1, wherein the computing step further comprises the step of:

computing the mean squared error (MSE) values by processing corresponding signal power magnitude values while shifting a start sample position of the feedback signal on a basis of a start sample position of the transmission signal by a predetermined sample unit.

4. The method according to claim 1, wherein the computing step further comprises the steps of:

computing the mean squared error (MSE) values by processing corresponding signal power magnitude values while shifting a start sample position of the transmission signal on a basis of a start sample position of the feedback signal by a predetermined sample unit.

5. The method according to claim 1, wherein:
the signal power magnitude values of the transmission and feedback signal are denoted by $Tx_n$ and $Fb_n$, respectively; and
the MSE values are computed by $$MSE = \sum_{n=1}^{M} \frac{(Tx_n - Fb_n)^2}{M},$$

wherein M denotes a number of samples from which an MSE value is computed.

6. The method according to claim 1, further comprising the step of:
computing the MSE value between samples at least two times.

7. An apparatus for estimating a signal delay between a transmission signal and a feedback signal, the apparatus comprising
a sample extractor for extracting samples with a predetermined length from the transmission and feedback signals;
a signal magnitude calculator for computing power magnitude values of the transmission and feedback signals in a sample unit;
memory blocks for storing the power magnitude values of the transmission and feedback signals; and
a delay estimator for computing mean squared error (MSE) values by processing corresponding signal power magnitude values while shifting a start sample position of one signal between the sampled transmission and feedback signals on a basis of a start sample position of another signal, and estimating a sample delay value from the shifted start sample position with a smallest MSE value.

8. The apparatus according to claim 7, wherein the memory blocks are programmable to sequentially store n samples of the transmission and feedback signals, and wherein the MSE value is computed from a number of samples less than n.

9. The apparatus according to claim 7, wherein the delay estimator is programmable to compute the MSE values while shifting a start sample position of the feedback signal on a basis of a start sample position of the transmission signal by a predetermined sample unit.

10. The apparatus according to claim 7, wherein the delay estimator is programmable to compute the MSE values while shifting a start sample position of the transmission signal on a basis of a start sample position of the feedback signal by a predetermined sample unit.

11. The apparatus according to claim 7, wherein:
the signal power magnitude values of the transmission and feedback signal are denoted by $Tx_n$ and $Fb_n$, respectively; and
the MSE values are computed by $$MSE = \sum_{n=1}^{M} \frac{(Tx_n - Fb_n)^2}{M},$$

wherein M denotes a number of samples from which an MSE value is computed.

12. The apparatus according to claim 7, wherein the delay estimator is programmable to compute an MSE value between samples at least two times.

13. A transmitter of a mobile communication system with a power amplifier, the transmitter comprising:
a digital pre-compensator that is configured to generate a pre-distortion signal to linearize an output signal of the power amplifier on a basis of a predetermined coefficient; and
a digital signal processor that is configured to perform delay compensation between a transmission signal and a feedback signal, and determine the coefficient, the digital signal processor comprising:
a pre-distortion (PD) that is configured to compute the coefficient by performing an adaptation algorithm, and updates a look-up table (LUT) of the digital pre-compensator; and
a loop delay tracker that is configured to compute mean squared error (MSE) values by processing corresponding signal power magnitude values while shifting one signal between the sampled transmission and feedback signals on a basis of a start sample position of another signal, and estimate a sample delay value from the shifted start sample position with a smallest MSE value.

14. The transmitter according to claim 13, wherein the loop delay tracker is programmable to compute the MSE values while shifting a start sample position of the feedback signal on a basis of a start sample position of the transmission signal by a predetermined sample unit.

15. The transmitter according to claim 13, wherein the loop delay tracker is programmable to compute the MSE values while shifting a start sample position of the transmission signal on a basis of a start sample position of the feedback signal by a predetermined sample unit.

* * * * *